(12) United States Patent
Ueda et al.

(10) Patent No.: US 10,996,257 B2
(45) Date of Patent: May 4, 2021

(54) INSULATING SUBSTRATE INSPECTING METHOD AND INSPECTING APPARATUS

(71) Applicant: Mitsubishi Electric Corporation, Tokyo (JP)

(72) Inventors: Tetsuya Ueda, Tokyo (JP); Kazuki Sameshima, Tokyo (JP); Hiroki Shiota, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 197 days.

(21) Appl. No.: 16/210,046

(22) Filed: Dec. 5, 2018

(65) Prior Publication Data

US 2019/0361067 A1   Nov. 28, 2019

(30) Foreign Application Priority Data

May 24, 2018   (JP) ................... JP2018-099744

(51) Int. Cl.
*G01R 31/26* (2020.01)
*G01R 31/12* (2020.01)
*G01R 31/16* (2006.01)

(52) U.S. Cl.
CPC ......... *G01R 31/1218* (2013.01); *G01R 31/16* (2013.01); *G01R 31/2642* (2013.01)

(58) Field of Classification Search
CPC combination set(s) only.
See application file for complete search history.

(56) References Cited

U.S. PATENT DOCUMENTS

| 5,150,058 A * | 9/1992 | Johnson ............... G01R 29/085 324/519 |
| 7,714,596 B2 * | 5/2010 | Chen ................... G01R 31/2648 324/715 |
| 2007/0139056 A1 * | 6/2007 | Kaneiwa ............ G01R 31/1227 324/536 |
| 2007/0170934 A1 * | 7/2007 | Ma .......................... H01L 22/14 324/754.14 |
| 2015/0260797 A1 * | 9/2015 | Yamashita ............. G01R 31/50 324/551 |
| 2016/0193814 A1 * | 7/2016 | Koike ..................... B32B 27/06 428/215 |
| 2017/0241895 A1 * | 8/2017 | Melapudi ............... G01N 27/20 |

FOREIGN PATENT DOCUMENTS

| JP | H08-015364 A | 1/1996 |
| JP | 2011-209266 A | 10/2011 |
| JP | 2013-120096 A | 6/2013 |

* cited by examiner

*Primary Examiner* — Thang X Le
(74) *Attorney, Agent, or Firm* — Studebaker & Brackett PC

(57) ABSTRACT

An insulating substrate inspecting method includes bringing a lower electrode into contact with lower metal of an insulating substrate including an insulating layer, the lower metal in contact with a lower surface of the insulating layer, and upper metal in contact with an upper surface of the insulating layer, and bringing an upper electrode into contact with the upper metal, and applying an AC voltage to the lower electrode and the upper electrode to detect electromagnetic waves generated at a defect in the insulating layer.

20 Claims, 17 Drawing Sheets

INSULATING SUBSTRATE INSPECTING METHOD AND INSPECTING APPARATUS

BACKGROUND

Field

The present invention relates to an insulating substrate inspecting method and an inspecting apparatus used for the method.

Background Art

There is a withstand voltage test in which an AC voltage is applied to an insulating substrate as a simple substance or a semiconductor device such as a power device to confirm that dielectric breakdown does not occur in these elements with a reference voltage. In this withstand voltage test, it is impossible to inspect the long-term reliability considering insulation degradation of semiconductor devices. Therefore, for example, JP2011-209266A discloses that an AC voltage is applied to a semiconductor device under a product state while the semiconductor device is irradiated with X-rays to detect a partial discharge occurring within an insulation defect in an insulating layer.

A semiconductor device such as a power module has a complicated structure. Accordingly, it is impossible to specify the generation direction of electromagnetic waves generated when a partial discharge occurs in the semiconductor device. Therefore, it is impossible to enhance the detection accuracy of the partial discharge. Particularly, in the case of a minute defect, a discharge charge amount is small, and the intensity of electromagnetic waves is weak, so that it becomes difficult to detect the electromagnetic waves.

It is conceivable that initial electrons are supplied to a defective portion to increase the amount of discharge by irradiating a semiconductor device with X-rays, thereby increasing the intensity of an electromagnetic wave signal, and also the detection sensitivity of the electromagnetic waves is enhanced by limiting the directivity, installation position and orientation of an antenna, the material of a housing, etc. However, when a semiconductor device under a product state is inspected, there are at least two problems described below. The first problem resides in that it is necessary to optimize the position and orientation of the antenna according to the type of a product, so that pre-adjustment is required to be performed according to the type of the product, which causes increase of the cost. The second problem resides in that a product disposal cost increases in such a case that a defect inspection is performed on a value-added semiconductor device in which formation of a power module or the like progresses to some extent, resulting in confirmation of insulation defect in the semiconductor device.

SUMMARY

The present invention has been made to solve the problem as described above and has an object to provide insulating substrate inspecting method and inspecting apparatus that are suitable for reduction of the cost.

In some examples, an insulating substrate inspecting method includes bringing a lower electrode into contact with lower metal of an insulating substrate including an insulating layer, the lower metal in contact with a lower surface of the insulating layer, and upper metal in contact with an upper surface of the insulating layer, and bringing an upper electrode into contact with the upper metal, and applying an AC voltage to the lower electrode and the upper electrode to detect electromagnetic waves generated at a defect in the insulating layer.

Other and further objects, features and advantages of the invention will appear more fully from the following description.

DETAILED DESCRIPTION

Insulating substrate inspecting method and apparatus according to an embodiment of the present invention will be described with reference to the drawings. The same or

First Embodiment

Figure 1:
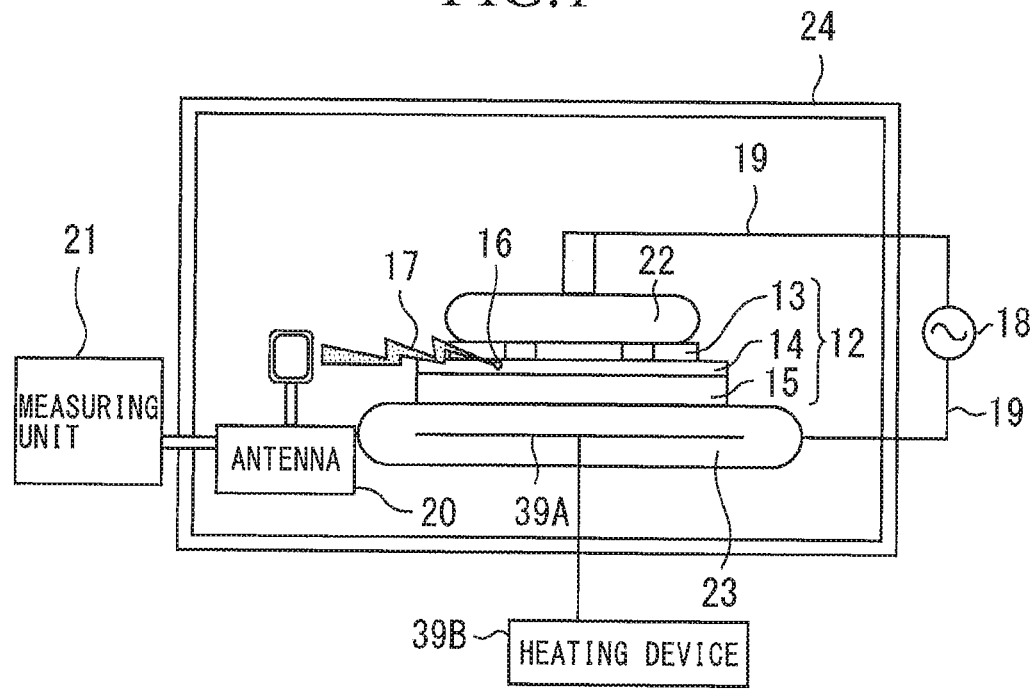
FIG. 1 is a diagram showing a configuration example of the inspecting apparatus according to the first embodiment.

FIG. 1 is a diagram showing a configuration example of the inspecting apparatus according to the first embodiment. An inspection target to which the inspecting apparatus is applied is, for example, an insulating substrate 12 having an insulating layer 14, lower metal 15 in contact with a lower surface of the insulating layer 14, and upper metal 13 in contact with an upper surface of the insulating layer 14. The upper metal 13 is, for example, a metal wire. The material of the insulating layer 14 is, for example, a ceramic or organic insulating material. The lower metal 15 is a metal base plate, a metal wire or metal foil. In the example of FIG. 1, the lower metal 15 is a metal base plate.

An upper electrode 22 and a lower electrode 23 are provided so as to be in contact with the insulating substrate 12 in order to apply a voltage to the insulating substrate 12. The lower electrode 23 has a flat portion on the upper surface thereof. The upper electrode 22 has a flat portion on the lower surface thereof. The upper electrode 22 is provided above the lower electrode 23 so as to face the lower electrode 23. A power supply unit 18 is a portion for applying an AC voltage to the lower electrode 23 and the upper electrode 22. The power supply unit 18 is electrically connected to the lower electrode 23 and the upper electrode 22 by a wiring 19.

The insulating layer 14 may have an insulating defect 16 such as a void, a delamination or a crack, for example. When an AC voltage is applied to the upper electrode 22 and the lower electrode 23, partial discharge occurs at the insulating defect 16 of the insulating layer 14. This partial discharge may cause generation of electromagnetic waves 17. The inspecting apparatus of FIG. 1 is provided with an antenna 20 for detecting the electromagnetic waves 17. The antenna 20 is not limited to a specific one insofar as it can detect electromagnetic waves, but it is a loop antenna having a coil, for example. The height of a loop face of the loop antenna for detecting electromagnetic waves is made to coincide with the height of the insulating layer 14, thereby enabling efficient detection of electromagnetic waves. The electromagnetic waves are detected by the antenna 20 and converted into current, and then the converted current is measured by a measuring device 21. The measuring unit 21 determines the presence or absence of an insulating defect 16 based on the presence or absence of this current, and also determines based on this current whether the partial discharge is strong or weak or the partial discharge is good or bad.

Figure 2:
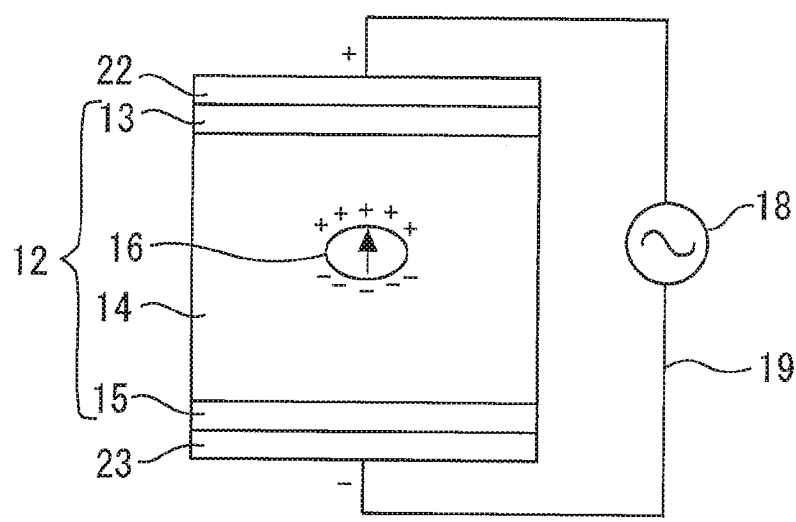
FIG. 2 is a diagram showing the principle of occurrence of the partial discharge.

FIG. 2 is a diagram showing the principle of occurrence of the partial discharge. An AC voltage is applied to the upper metal 13 and the lower metal 15 of the insulating substrate 12 by the upper electrode 22, the lower electrode 23, the wire 19, and the power supply unit 18, whereby a high voltage concentrates on the upper and lower ends of the insulating defect 16. When the voltage exceeds a certain threshold value, discharge occurs at the upper and lower ends of the insulating defect 16. In addition, electromagnetic waves are generated by a partial discharge current at that time. The direction of the voltage in FIG. 2 is an example.

A metal housing 24 covering the lower electrode 23, the upper electrode 22, the antenna 20 and the like is shown in FIG. 1. The metal housing 24 reflects and blocks electromagnetic wave noise from the outside. Accordingly, the inspection accuracy can be enhanced by inspecting the insulating substrate 12 in a state where the insulating substrate 12, the lower electrode 23, the upper electrode 22, and the antenna 20 are covered by the metal housing 24.

Figure 3:
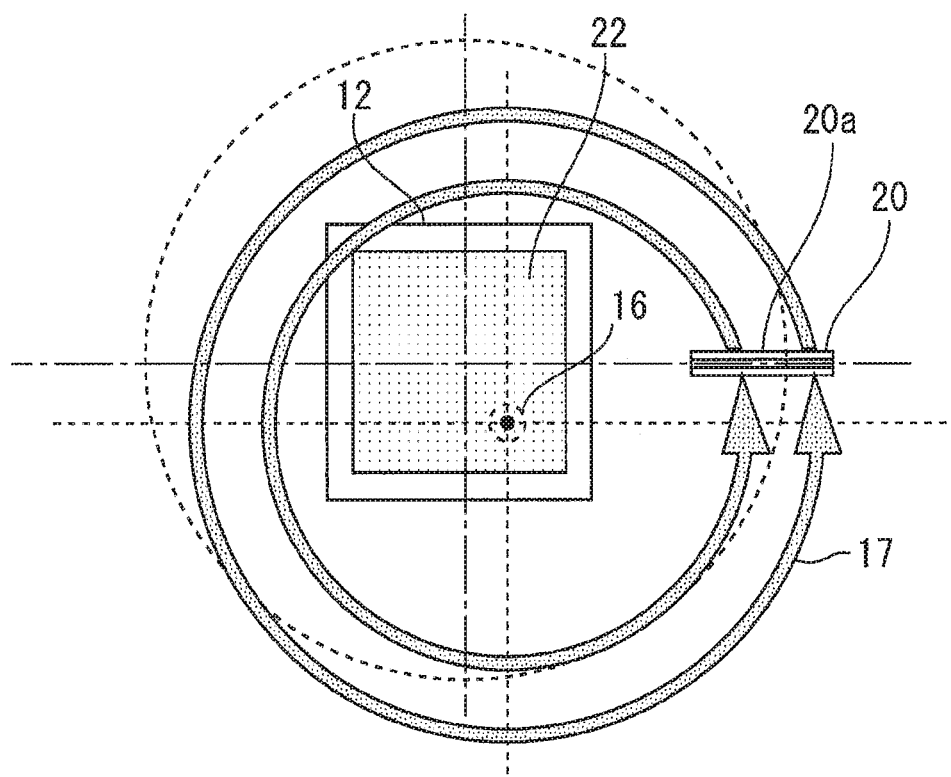
FIG. 3 is a plan view showing an arrangement example of the antenna.

FIG. 3 is a plan view showing an arrangement example of the antenna 20. The antenna 20 is provided at a position where a larger amount of a magnetic flux of the electromagnetic waves 17 generated by the partial discharge current crosses a coil portion of the antenna 20 vertically so that a larger amount of the magnetic flux can be detected according to the Faraday's law of electromagnetic induction. For example, the antenna 20 can be arranged so that the insulating layer 14 is positioned in a tangential direction of the loop face 20a of the antenna 20. For example, the antenna 20 can be installed so that the loop face 20a is vertical to a circle centered about the insulating substrate 12. Such an arrangement of the antenna enhances measurement sensitivity.

Figure 4:
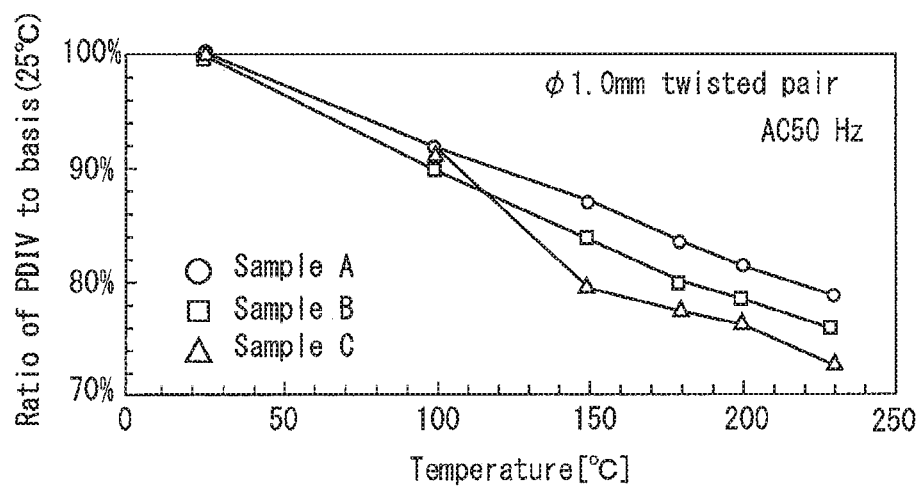
FIG. 4 is a diagram showing the temperature-dependence of a partial discharge starting voltage.

FIG. 4 is a diagram showing the temperature-dependence of a partial discharge starting voltage. It is understood from FIG. 4 that the partial discharge is more apt to occur as the temperature of a sample is higher. Therefore, by detecting the electromagnetic waves while heating the lower electrode 23, the upper electrode 22 or the metal housing 24, it is possible to detect partial discharge from an insulating defect 16 which cannot be detected at the room temperature. As an example, FIG. 1 shows a configuration in which a heating portion 39 A is embedded in the lower electrode 23 and the heated portion 39A is heated by a heating device 39B. The heating degree of the lower electrode 23, the upper electrode 22 or the metal housing 24 may be determined according to the detection accuracy to be required. For example, it is possible to increase the temperature of the insulating substrate 12 up to a market operating environment temperature after productization and then measure an insulation defect. As a result, it is possible to find out an insulating defect 16 which is caused by a product structure due to the temperature variation or an insulating defect 16 which has increased in size due to the temperature variation.

In the insulating substrate inspecting method according to the first embodiment, the lower electrode 23 is first brought into contact with the lower metal 15 of the insulating substrate 12, and then the upper electrode 22 is brought into contact with the upper metal 13. Subsequently, an AC voltage is applied to the lower electrode 23 and the upper electrode 22 to detect electromagnetic waves generated at the insulating defect 16 of the insulating layer 14, whereby it is possible to determine whether the insulating substrate 12 is good or not. A semiconductor device such as a power module to be used at a high voltage is formed on an insulating substrate 12 having no problem, for example, by a well-known semiconductor process. On the other hand, an insulating substrate 12 for which electromagnetic waves exceeding a specified value are detected is discarded before starting the semiconductor process or before starting the main process of the semiconductor process.

When a power device is formed in a semiconductor process, the presence or absence of a defect in the insulating layer 14 and the degree of the defect are one piece of information for determining the insulation performance of the device. As described above, by inspecting the insulating substrate 12 before starting essential processing, it can be avoided that an insulating substrate having a defect is introduced into a manufacturing line or a product having high added value is discarded because of a defect in an insulating layer. Even in the case of plural insulating substrates on which different products are to be formed, the shapes and thicknesses of the insulating substrates are substantially similar to one another. That is, it is possible to unify the specifications of the inspecting apparatus by inspecting the discharge of the insulating substrate 12 according to the foregoing insulating substrate inspecting method before starting the semiconductor process or before starting the main process of the semiconductor process. Specifically, the drift direction of charges caused by a defect in the insulating substrate 12 before starting the semiconductor process or before starting the main process of the semiconductor process can be regarded to be constant, and thus the magnetic field of electromagnetic waves generated due to the drift of the charges occurs concentrically in a planar direction of the insulating substrate 12. Therefore, the arrangement and orientation of coils of a measuring device such as an antenna can be fixed, and it is unnecessary to change the arrangement and orientation of the coils according to the product specification. On the other hand, when it is attempted to inspect products having different shapes with one inspecting apparatus, it is necessary to adjust a measuring system according to each product.

Figure 5:
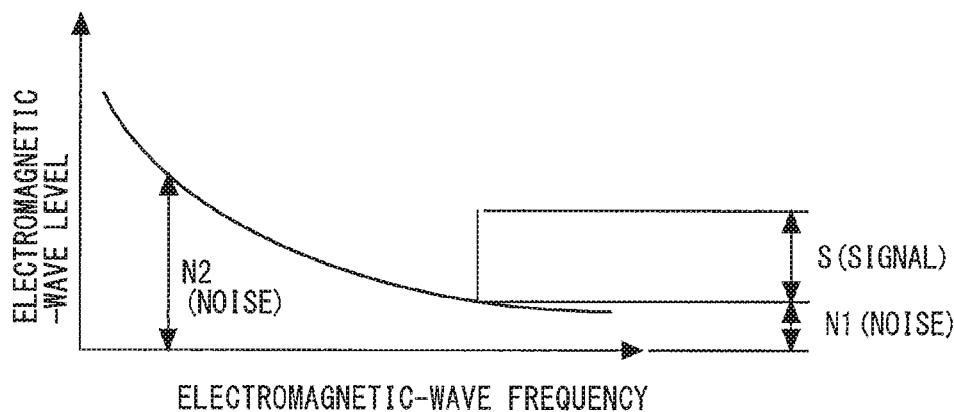
FIG. 5 is a diagram showing the electromagnetic-wave frequency dependence of the electromagnetic-wave level of noise.

FIG. 5 is a diagram showing the electromagnetic-wave frequency dependence of the electromagnetic-wave level of noise detected by the antenna. The antenna 20 detects not only electromagnetic waves 17 generated from the insulating defect 16, but also noise electromagnetic waves N1 generated, for example, in other peripheral devices. The frequencies of the electromagnetic waves 17 and the noise electromagnetic waves N1 are over a broad range, and the electromagnetic-wave levels of both the electromagnetic waves 17 and N1 decrease as the frequencies thereof increase. In a high frequency region of about several GHz, the electromagnetic-wave level of the noise electromagnetic waves N1 decreases to be lower than the electromagnetic-wave level of the electromagnetic waves 17. Accordingly, for example, by detecting the electromagnetic waves 17 at a frequency of 1 to 10 GHz, the noise can be suppressed as compared with a case where the electromagnetic waves 17 are detected at a frequency smaller than the above frequency. In order to detect the electromagnetic waves 17 at a frequency of 1 to 10 GHz, the detection frequency of the antenna can be set. As a result, it is possible to perform measurement with a high S/N ratio.

Furthermore, by measuring the electromagnetic waves 17 in the metal housing 24, the electromagnetic waves can be reflected by the inner wall of the metal housing 24, so that electromagnetic waves can be made vertically incident to the antenna 20. This enables increase of a detection possibility under a condition providing the highest S/N ratio, and also makes it possible to cut off or reduce external electromagnetic wave noise components caused by other peripheral devices of the inspecting apparatus, etc.

Figure 6:
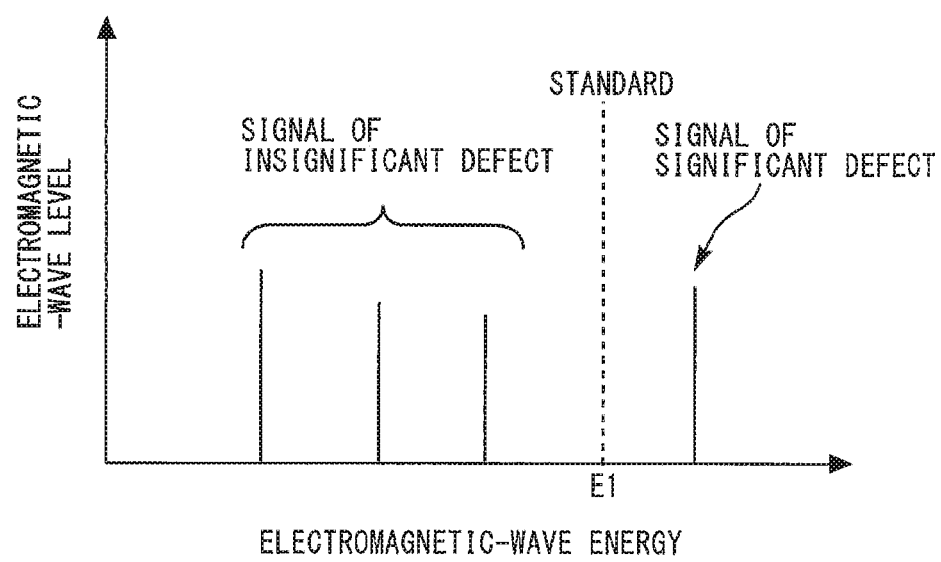
FIG. 6 is a diagram showing an example of the electromagnetic wave energy of detected electromagnetic waves.

FIG. 6 is a diagram showing an example of the electromagnetic wave energy of detected electromagnetic waves 17. As shown in FIG. 6, the energy of the electromagnetic waves 17 is not constant, and electromagnetic waves 17 having different energies can be detected. The variation in energy is caused, for example, by variations in the type, shape or size of the insulating defect 16. Therefore, a correlation between the type, shape or size of the insulating defect 16 and the energy of the electromagnetic waves 17 is obtained in advance, and based on the correlation, the type, shape or size of the insulating defect 16 can be estimated from the energy of the electromagnetic waves detected in the inspection of the insulating substrate 12. For such estimation, the detected electromagnetic waves 17 can be subjected to energy dispersion. For example, E1 may be set as the electromagnetic wave energy corresponding to the upper limit of the size of the insulating defect 16, and when the energy of the detected electromagnetic waves is larger than the predetermined value E1, it may be determined that the insulating substrate 12 is defective. By setting such a criteria, even when a discharge caused by an insignificant and negligible insulation defect occurs, it can be avoided that the insulating substrate 12 is discarded for the above reason.

Figure 7:
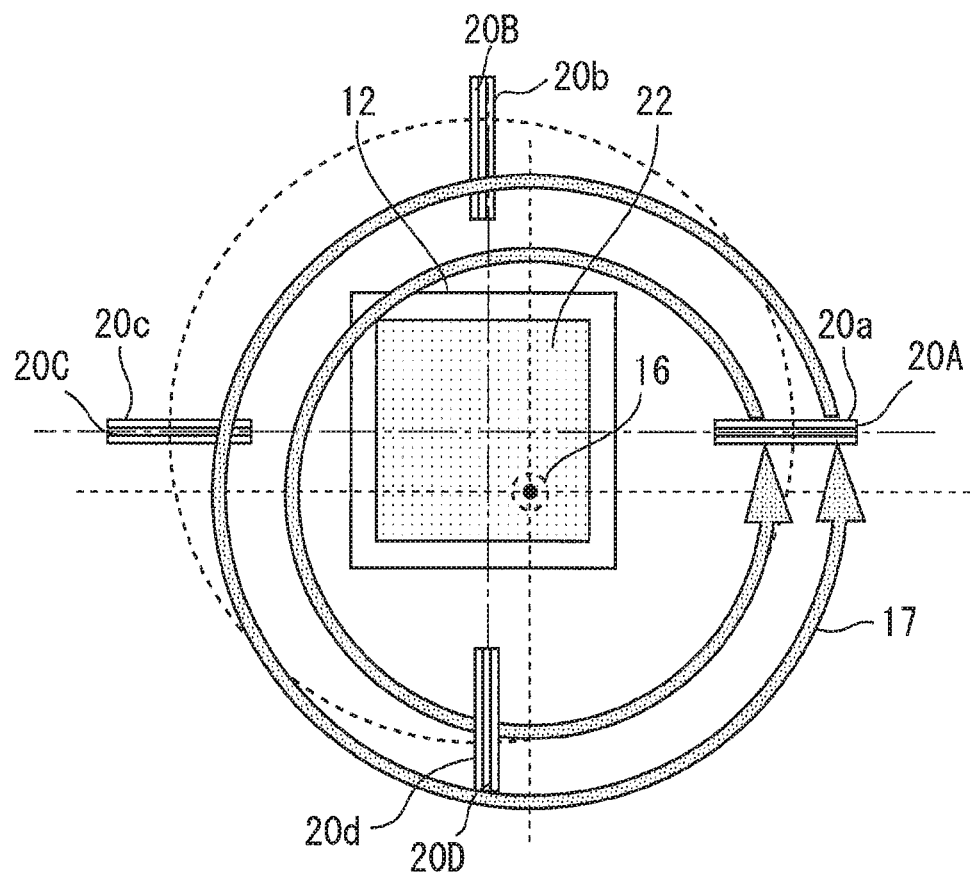
FIG. 7 is a diagram showing a configuration example of an inspecting apparatus provided with plural antennas.

FIG. 7 is a diagram showing a configuration example of an inspecting apparatus provided with plural antennas. The antennas 20A, 20B, 20C, and 20D surround the upper electrode 22 and the insulating substrate 12 as a whole. The antennas 20A, 20B, 20C, and 20D are loop antennas, for example. Circles marked with arrows in FIG. 7 are lines of magnetic force generated concentrically by the insulating defect 16. The antennas 20A, 20B, 20C, and 20D can be arranged so that the insulating layer 14 is located in the tangential direction of loop faces 20a, 20b, 20c, 20d of the antennas 20A, 20B, 20C, and 20D. Furthermore, the antennas 20A, 20B, 20C, and 20D can be provided so that the loop surfaces 20a, 20b, 20c, and 20d are vertical to the lines of magnetic force. As described above, the frequency of the electromagnetic waves 17 generated due to the insulating defect 16 and the frequency of the noise electromagnetic wave are not constant. Therefore, by providing plural loop antennas and making the detection frequencies of the plural loop antennas different from one other, the signal and the noise can be easily discriminated from each other. It is possible to perform measurement with a high S/N ratio by providing an antenna having a frequency characteristic close to the frequency characteristic of noise electromagnetic waves, for example.

Various technical features described with respect to the first embodiment can be applied to insulating substrate inspecting method and apparatus according to the following embodiments. The insulating substrate inspecting method and apparatus according to the following embodiments have many common points to the first embodiment, and thus differences from the first embodiment will mainly be described.

Second Embodiment

Figure 8:
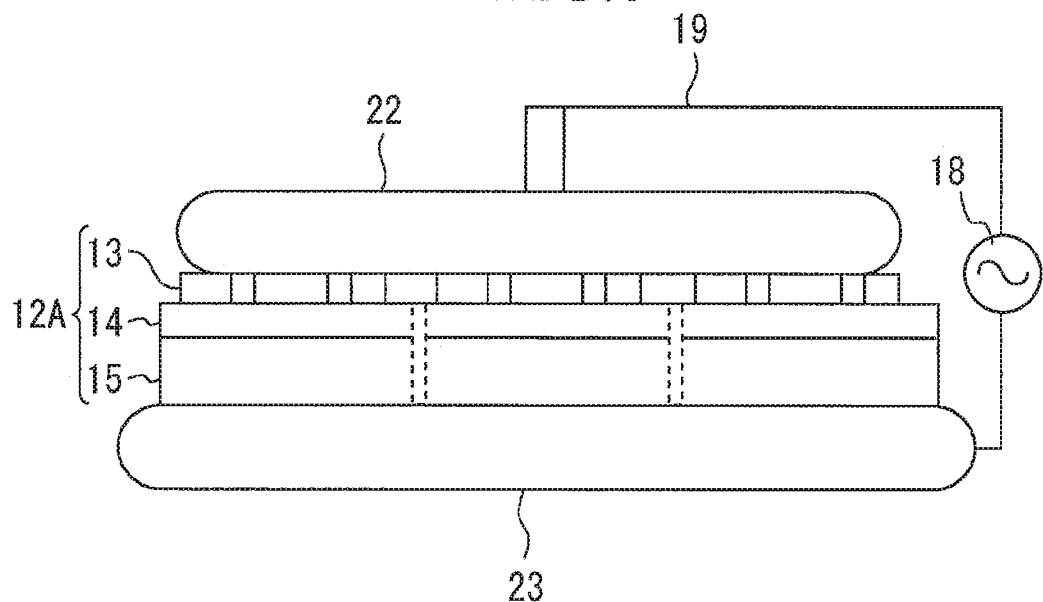
FIG. 8 is a diagram showing an example of an insulating substrate inspecting method according to a second embodiment.

FIG. 8 is a diagram showing an example of an insulating substrate inspecting method according to a second embodiment. An insulating substrate 12A is a worksheet in which plural unit structures are integrated. The insulating substrate 12 in FIG. 1 is obtained by dividing the worksheet into individual pieces. Therefore, it can be regarded that the insulating substrate 12A of FIG. 8 is one in which plural insulating substrates 12 of FIG. 1 are arranged and integrated with one another on a plane. The upper metal 13 of the insulating substrate 12A is patterned. The upper metal 13 is a circuit pattern of the insulating substrate 12A.

Figure 9:
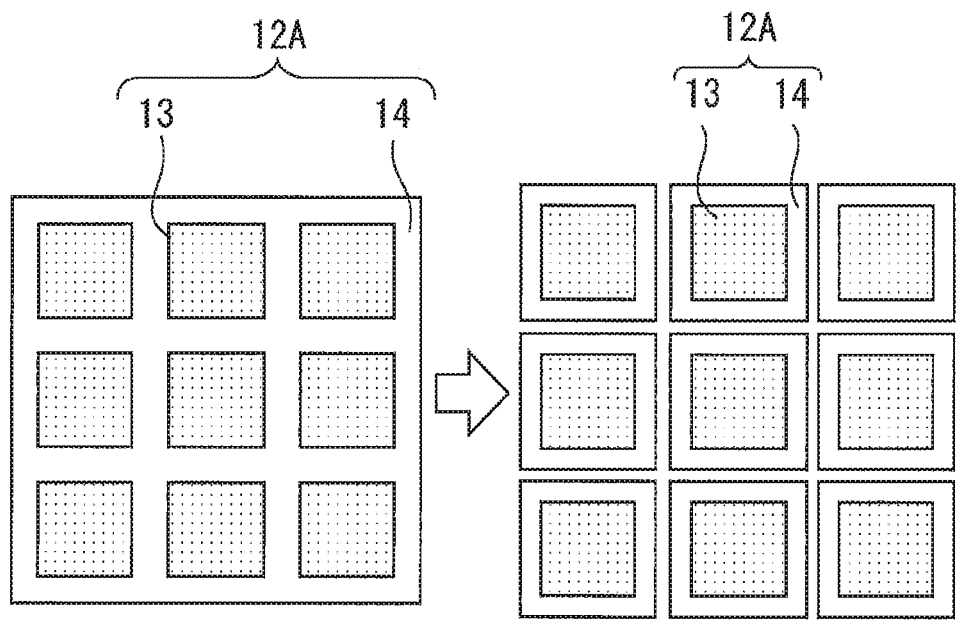
FIG. 9 is a schematic diagram of the worksheet.

FIG. 9 is a schematic diagram of the worksheet. In this example, the insulating substrate 12A as a worksheet has nine unit structures. Since this worksheet is an article under a process of manufacturing an insulating substrate, it can be called as a semifinished product of an insulating substrate. By performing the above-described defect inspection on this worksheet, it is possible to collectively inspect insulation defects 16 inherent in insulating layers 14 of plural unit structures, so that the throughput can be improved. Since the sizes of worksheets are limited to about 1 to 3 types for common use of the apparatus and enhancement of production efficiency by manufacturers for insulating substrates, the inspecting apparatus for inspecting defects on a worksheet basis enables sharing of the inspecting apparatus.

Figure 10:
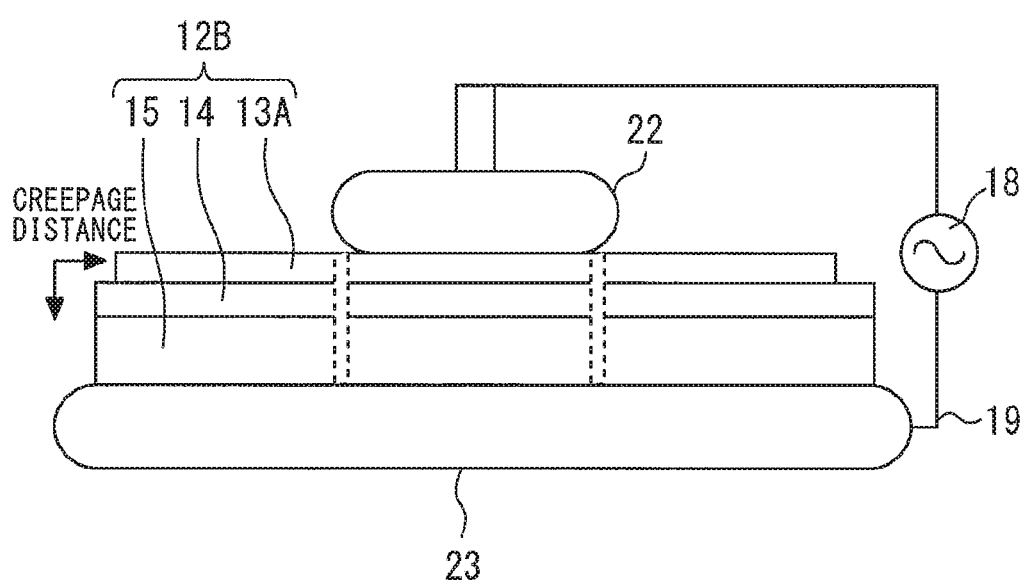
FIG. 10 is a diagram showing a modification of the worksheet.
Figure 11:
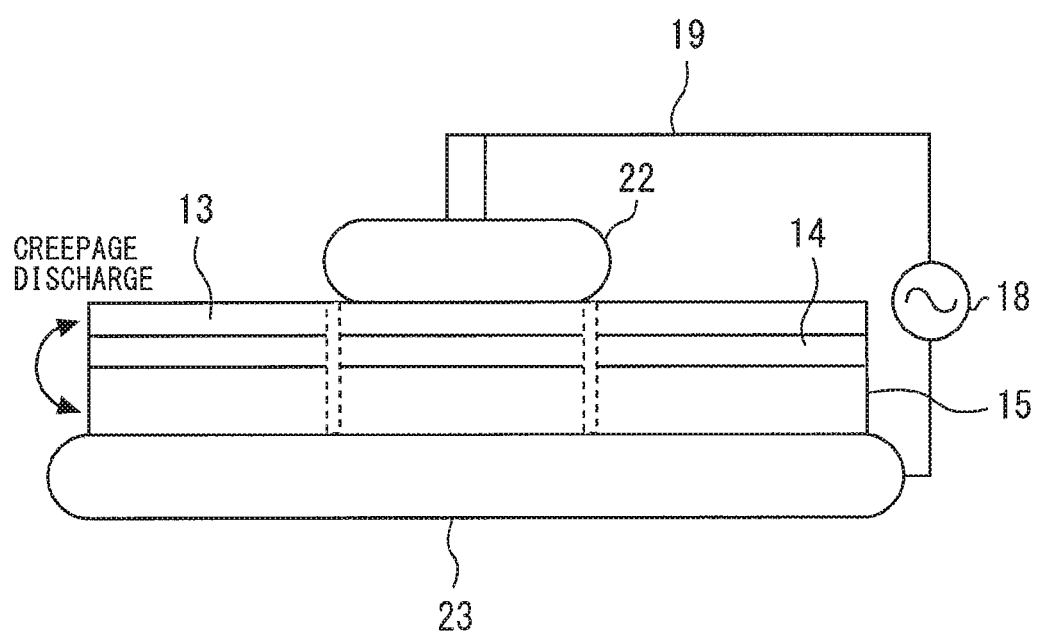
FIG. 11 shows the upper metal and the lower metal having the same size.

FIG. 10 is a diagram showing a modification of the worksheet as an inspection target. The insulating substrate 12B is a worksheet in which plural unit structures are integrated with one another. The upper metal 13A is not subjected to patterning. The upper metal 13A is one metal layer for exposing a part along an outer edge of the upper surface of the insulating layer 14. That is, the upper metal 13A is in a state of a metal plate before a wiring pattern is processed. In this case, as shown in FIG. 11, when the upper metal 13 and the lower metal 15 have the same size and the upper metal 13 is also present on the outer edge of the insulating layer 14, only a creepage distance which corresponds to the thickness of the insulating layer 14 can be secured between the upper metal 13 and the lower metal 15. In this case, there may occur such a disadvantage that leak current flows between the upper metal 13 and the lower metal 15 when a voltage is applied therebetween. This disadvantage hinders the voltage application to the insulating defect 16 and makes it impossible to perform the partial discharge inspection.

Therefore, in the example of FIG. 10, a creepage distance between the upper metal 13A and the lower metal 15 is secured by forming the upper metal 13A so as to avoid the portion along the outer edge of the insulating layer 14. This can be realized, for example, by making the size of the upper metal 13A smaller than the size of the lower metal 15. Accordingly, in the example of FIG. 10, it is possible to efficiently detect defects on a worksheet basis, and also the shape of the upper metal can be made common regardless of the design of the wiring pattern of the upper metal. Sharing the shape of the upper metal makes it possible to reduce the size of the upper electrode 22.

Figure 12:
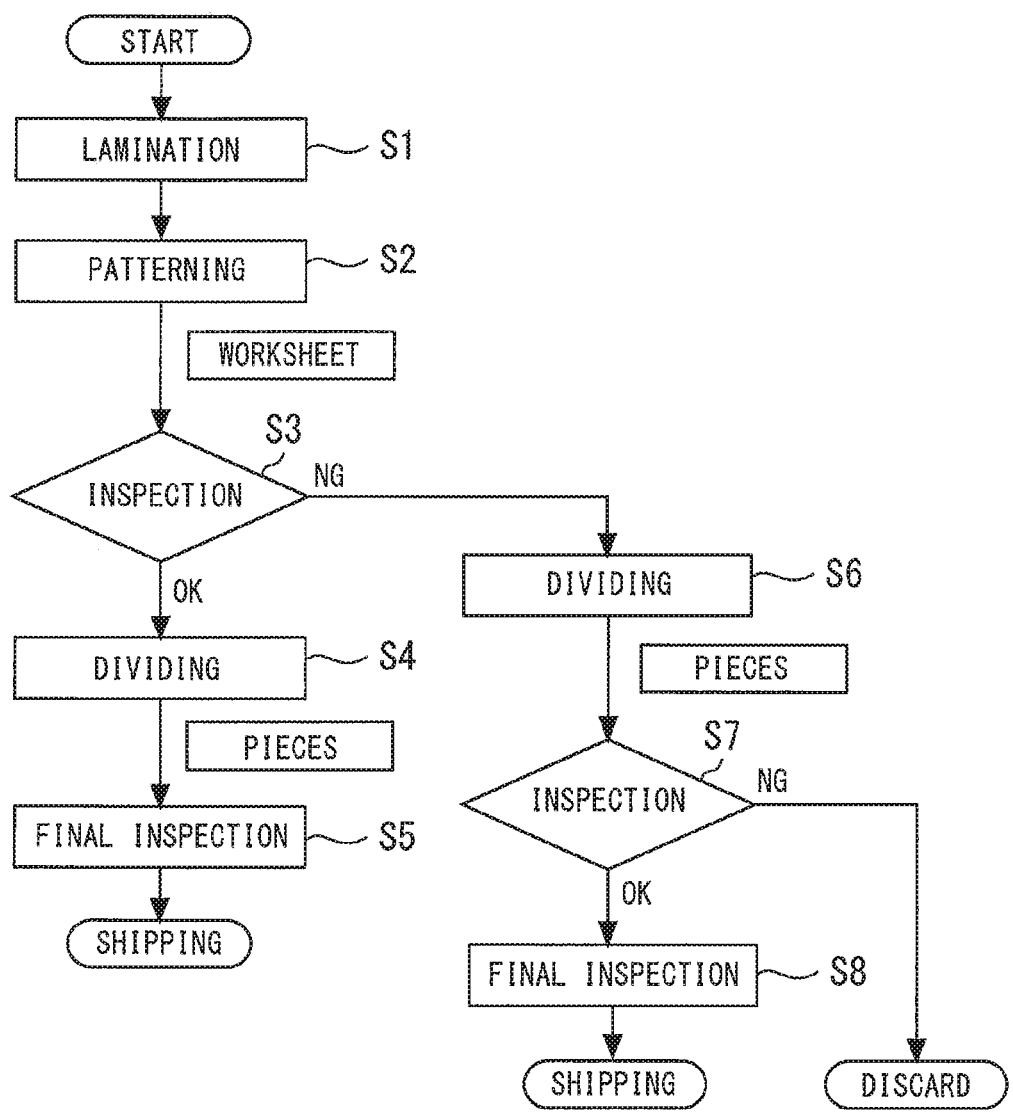
FIG. 12 is a flowchart of an insulating substrate manufacturing method.

FIG. 12 is a flowchart of an insulating substrate manufacturing method including inspection of an insulating substrate. In first step S1, a worksheet is First manufactured by lamination and other steps. Next, in step S2, the upper metal of the worksheet is patterned.

Subsequently, the process proceeds to step S3. In step S3, the insulation defect measurement is performed on the worksheet by using the foregoing electromagnetic-wave detection using the inspecting apparatus of FIG. 1, for example. A worksheet for which determination of OK has been made is divided into individual pieces in step S4, thereby dividing the worksheet into pieces each having a product size. Then, the process proceeds to a final inspection in step S5, and the products are shipped when no problem is found.

On the other hand, when determination of NG is made in step S3, the worksheet is divided into individual pieces in step S6. Thereafter, in step S7, the insulation defect inspection is conducted again on the divided individual insulating substrates again. When it is determined for a divided individual insulating substrate that there is no insulating defect 16 or an insulating defect 16 is negligibly small, the insulating substrate is determined to be OK, subjected to the final inspection in step S8, and then shipped when there is no problem. An insulating substrate which has been determined to be NO in step S7 is not conveyed to the next step, but is discarded.

As described above, when an insulation defect is found in the insulation defect measurement on the worksheet and thus the determination of NG is made, after dividing the worksheet into individual pieces, for example, the insulation defect measurement is performed on the insulating substrates after dividing, which is described with respect to the first embodiment. Based on an inspection result after dividing into individual pieces, it is determined for each insulating substrate after dividing into individual pieces whether the divided individual insulating substrate is good or not. On the other hand, when no determination of NG is made in the inspection on the worksheet, the inspection after dividing into individual pieces can be omitted, so that this process is more efficient than the process of inspecting the insulating substrates after dividing into individual pieces one by one.

Third Embodiment

Figure 13:
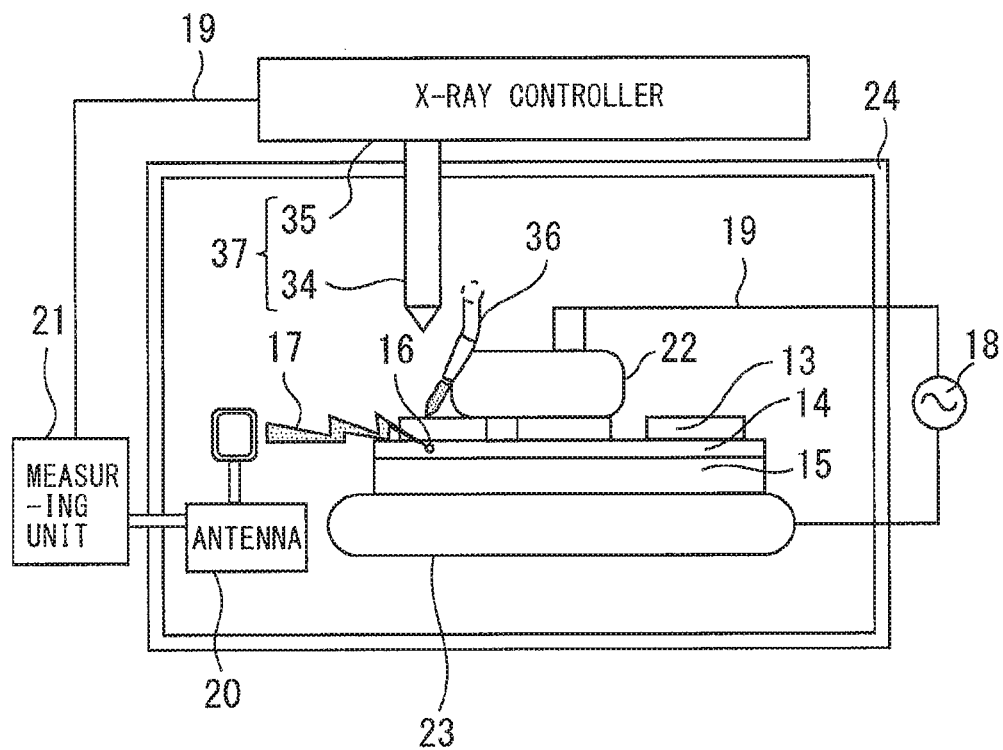
FIG. 13 is a diagram showing a configuration example of the inspecting apparatus according to a third embodiment.

FIG. 13 is a diagram showing a configuration example of the inspecting apparatus according to a third embodiment. This inspecting apparatus includes an X-ray irradiation device 37 which is provided above the upper electrode 22 and irradiates X-rays in a direction to the lower electrode 23. The X-ray irradiation device 37 includes an X-ray irradiation unit 34 and an X-ray controller 35. The X-ray irradiation unit 34 may be provided inside the metal housing 24 while the X-ray controller 35 is provided outside the metal housing 24. Upon receiving a command from the X-ray controller 35, the X-ray irradiation unit 34 irradiates X-rays. With respect to the partial discharge at the insulating defect 16 of the insulating layer 14, no partial discharge occurs unless the voltage is equal to or more than the partial discharge start voltage. However, by irradiating the insulating substrate with X-rays, electrons are excited to make the partial discharge apt to occur. Therefore, it is possible to detect an insulating defect 16 by applying a lower voltage or detect a smaller insulating defect 16 by applying the same voltage. Furthermore, the X-ray irradiation unit 34 or the lower electrode 23 supporting the insulating substrate 12 is made movable, and X-rays are scanned on the insulating substrate, whereby the position of the insulating defect 16 on the worksheet can be known.

The insulating substrate used in the insulating substrate inspecting method according to the third embodiment is a worksheet in which plural unit structures are integrated with one another. By detecting electromagnetic waves while scanning X-rays onto the insulating substrate from the upper side of the insulating substrate, a unit structure in which a defect exists can be specified from a scanning position of the X-rays when the electromagnetic waves are detected.

Figure 14:
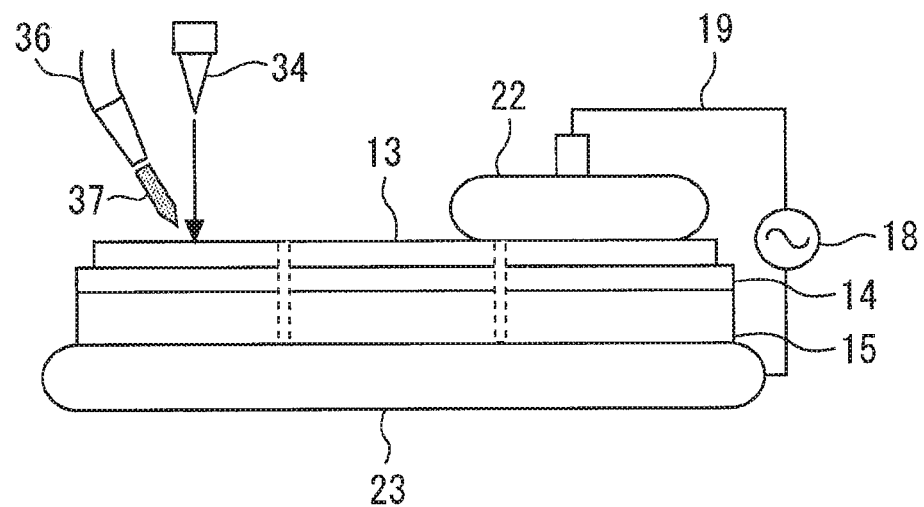
FIG. 14 shows marking method.
Figure 15:
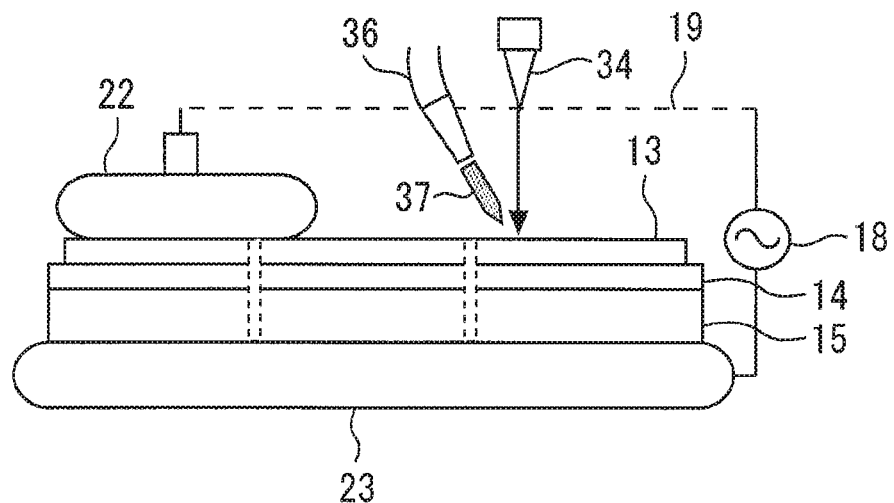
FIG. 15 shows marking method.

The inspecting apparatus of FIG. 13 includes a marking device 36 for marking a unit structure in which a defect exists. As shown in FIGS. 14 and 15, a site for which the determination of NG has been made due to the insulating defect 16 is marked by the marking device 36, whereby an insulating substrate after dividing which is to be discarded can be specified. Instead of marking, a coordinate on a worksheet for which the determination of NG has been made is recorded by the measuring unit 21, whereby an insulating substrate to be discarded after dividing can be clarified.

In the example of FIGS. 13 to 15, the size of the upper electrode 22 is made smaller than that of the worksheet so that X-rays are not blocked by the upper electrode 22.

Figure 16:
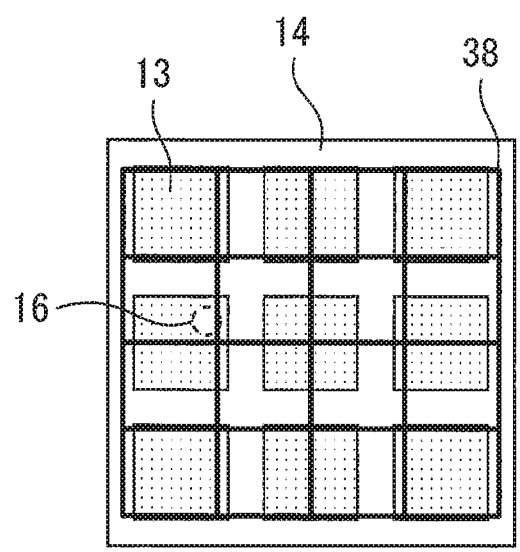
FIG. 16 is a plan view showing a grid-like tipper electrode.
Figure 17:
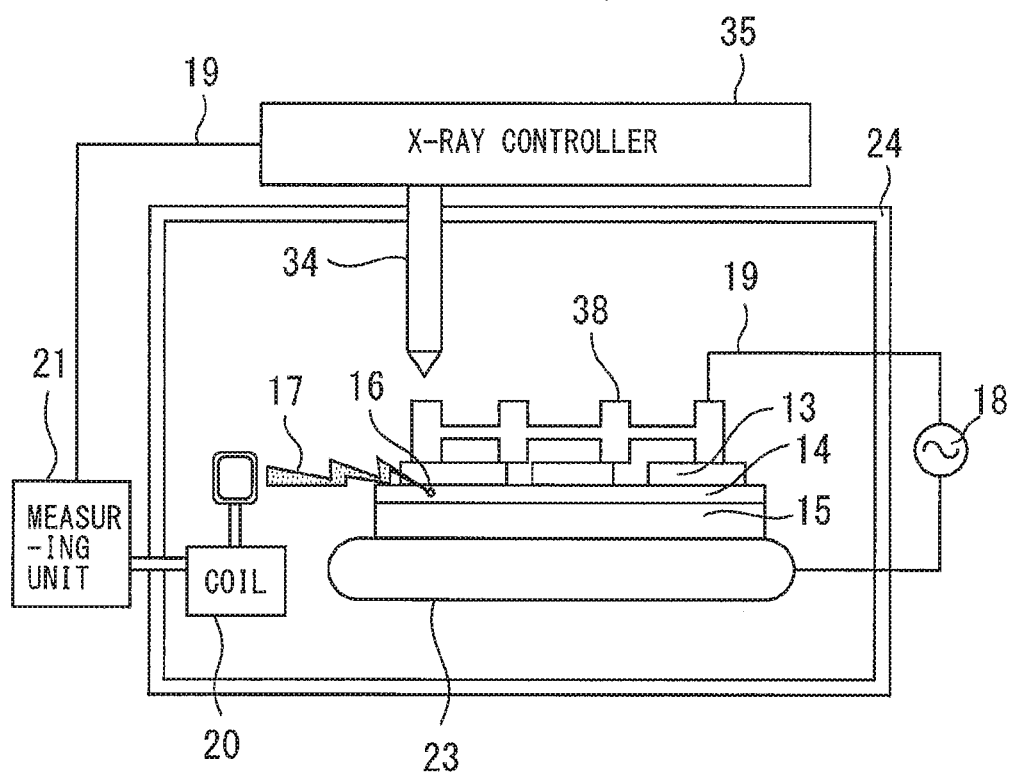
FIG. 17 is a diagram showing a configuration example of an inspecting apparatus having the grid-like upper electrode.

FIG. 16 is a plan view showing a grid-like upper electrode 38. The upper electrode 38 has a grid-like shape. The grid-like shape enables the upper electrode 38 to be in contact with the upper metal 13 over a broad range of the upper metal 13, and also enables X-ray irradiation to the insulating substrate. FIG. 17 is a diagram showing a configuration example of an inspecting apparatus having the grid-like upper electrode 38.

Figure 18:
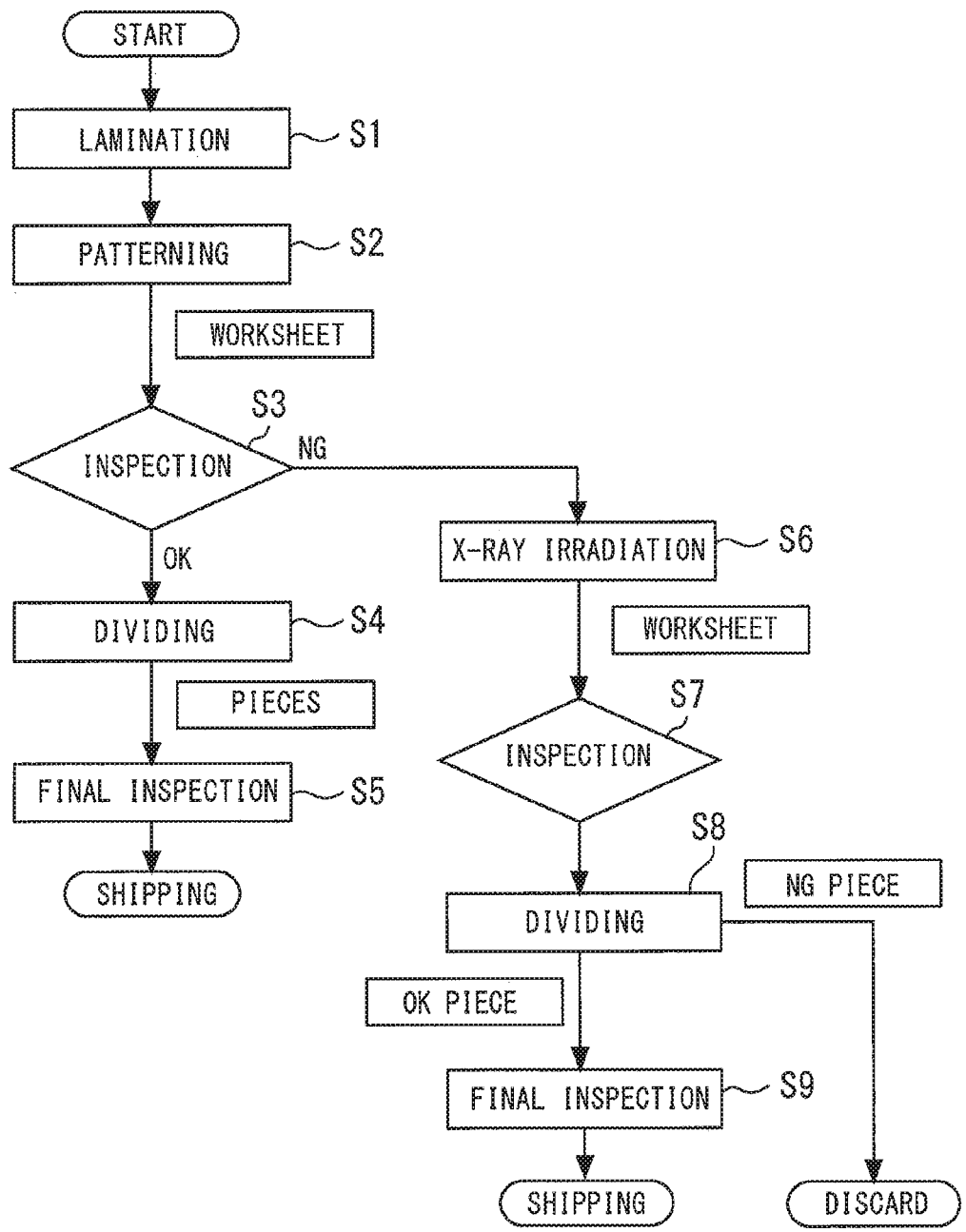
FIG. 18 is a flowchart of an insulating substrate manufacturing method.

FIG. 18 is a flowchart of an insulating substrate manufacturing method including the inspection of the insulating substrate according to the third embodiment. First, a worksheet is manufactured in step S1. Next, in step S2, the upper metal is patterned to form wires. Thereafter, in step S3, the insulation defect measurement is performed in the same manner as the first embodiment. That is, X-rays are not irradiated in the inspection in step S3. A worksheet for which the determination of OK has been made is divided into pieces each having a product size by dividing into individual pieces in step S4. Thereafter, in step S5, the final inspection is performed, and when no problem is found, shipping is performed.

With respect to a worksheet for which the determination of NG has been made in step S3, X-rays are irradiated onto the insulating substrate of the worksheet in step S6, and the X-rays are scanned on the insulating substrate in step S7, thereby performing the insulation defect measurement. At this time, the position of an insulating defect 16 on the worksheet is specified.

Thereafter, in step S8, the worksheet is divided into individual pieces to form insulating substrates each having a product size. Thereafter, an insulating substrate which has passed the inspection in step S7 is conveyed to the final inspection step in step S9, and shipped when there is no problem. On the other hand, an insulating substrate which has failed the inspection in step S7 is not conveyed to the next step, and is discarded. As a result, insulating substrates each including an insulating defect 16 can be discarded before they are marketed, and the inspection step after dividing into individual pieces for defective products can be omitted.

Fourth Embodiment

Figure 19:
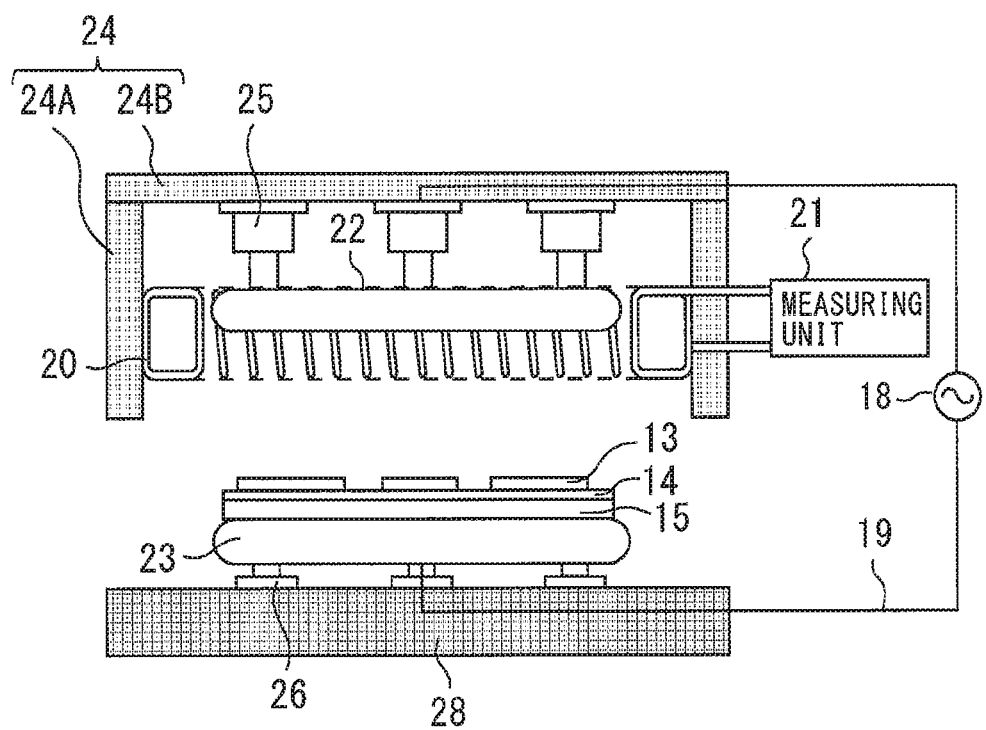
FIG. 19 is a diagram showing a configuration example of an inspecting apparatus according to a fourth embodiment.

FIG. 19 is a diagram showing a configuration example of an inspecting apparatus according to a fourth embodiment. The metal housing 24 has a support portion 24A surrounding the upper electrode 22, and a lid portion 24B provided on the support portion 24A. The upper electrode 22 is attached to the lid portion via a conductive first elastic body 25. The first elastic body 25 is, for example, a piston for changing the distance between the upper electrode 22 and the lid portion 24B. The lower electrode 23 is attached to a stage 28 via a conductive second elastic body 26. The stage 28 is, for example, a metal. The second elastic body 26 is, for example, a piston for changing the distance between the lower electrode 23 and the stage 28. Under the inspection, an AC voltage is applied to the lower electrode 23 and the upper electrode 22 via the first elastic body 25 and the second elastic body 26 by the power supply unit 18.

Figure 20:
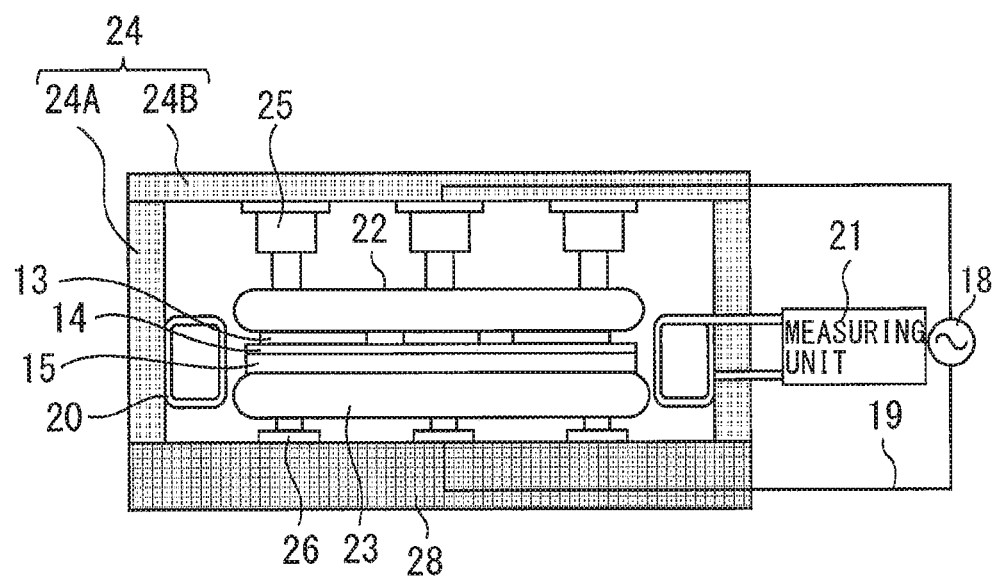
FIG. 20 shows metal housing contact with the stage.

As shown in FIG. 19, by separating the metal housing 24 and the stage 28 from each other, the worksheet can be placed on the lower electrode 23 or left away from the lower electrode to take out the worksheet. On the other hand, under the insulation defect measurement, by bringing the metal housing 24 into contact with the stage 28 as shown in FIG. 20, the influence of electromagnetic waves from the outside on the measurement result is suppressed. The wire 19 is passed through the metal housing 24 and the stage 28, and connected to the first elastic body 25 and the second elastic body 26. Since the distance between the upper electrode 22 and the lower electrode 23 can be changed by expansion and contraction of the first elastic body 25 and the second elastic body 26, it is possible to cope with the change of the thickness of the worksheet. Therefore, the insulation defect measurement can be performed on different types of products in the thickness by using the same apparatus.

Fifth Embodiment

Figure 21:
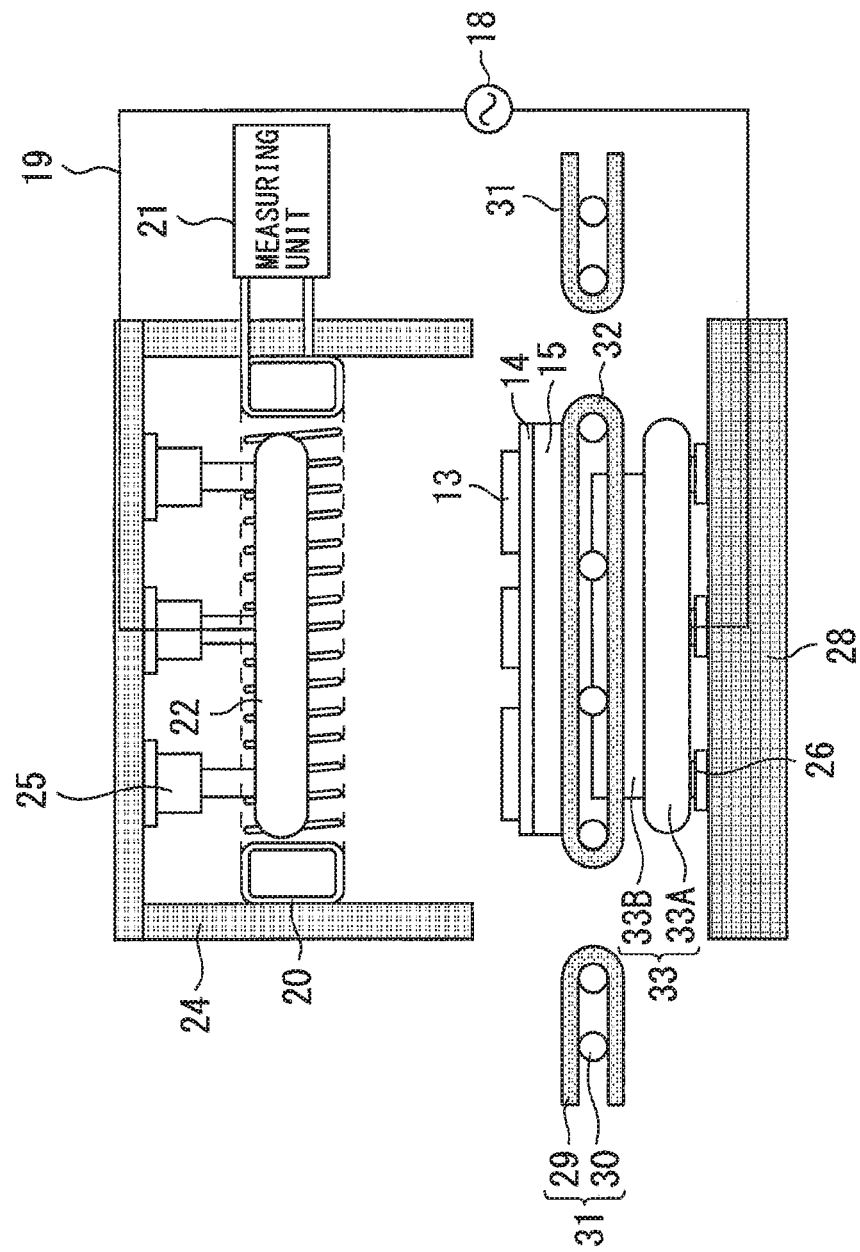
FIG. 21 is a diagram showing a configuration example of an inspecting apparatus according to a fifth embodiment.

FIG. 21 is a diagram showing a configuration example of an inspecting apparatus according to a fifth embodiment. The inspecting apparatus of the fifth embodiment and the inspecting apparatus of the fourth embodiment are identical to each other in that they have the first elastic body 25 and the second elastic body 26. A lower electrode 33 in FIG. 21 includes a base portion 33A supported by the second elastic body 26, and a slit portion 33B having slits. Accordingly, the slits are formed at the upper portion of the lower electrode 33. Parts of slit belts 32 are located in the slits. The slit belts 32 advance in a feeding or returning direction by a conveying roller 30. The slit belts 32 and the conveying roller 30 constitute a conveying line 31 for conveying the worksheet. FIG. 21 is a diagram when the insulating substrate is exchanged before and after the insulation defect measurement. Depending on the configuration of the apparatus, the slit belts may be substituted by a single belt. The belts provided in the slits of the lower electrode 33 are brought into contact with the lower surface of the lower metal 15, and the belts are driven, whereby the insulating substrate can be moved.

As shown in FIG. 21, a conveying line 31 can also be installed outside the metal housing 24. Automatic conveyance of the conveying line 31 makes it possible to incorporate the above-described insulation defect measurement in the process in an in-line mode. A conveying belt 29 on the outside of the metal housing 24 is not required to be a slit belt.

Figure 22:
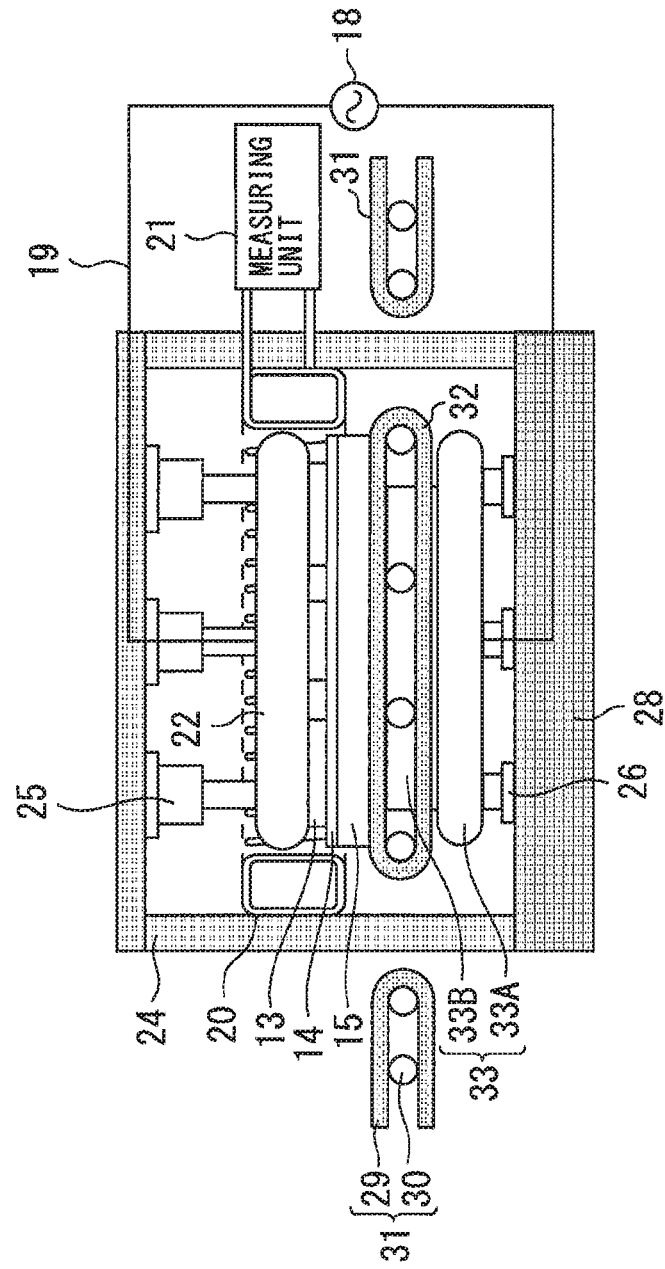
FIG. 22 is a diagram showing the inspecting apparatus under the inspection of the insulating substrate.

FIG. 22 is a diagram showing the inspecting apparatus under the inspection of the insulating substrate. Under the insulation defect inspection, the metal housing 24 and the stage 28 are brought into contact with each other, and at the same time, the slit portion 33B is located at a position which is the same height as or higher than the upper surface of the slit belt 32, and the slit portion 33B and the lower metal 15 are brought into contact with each other.

Figure 23:
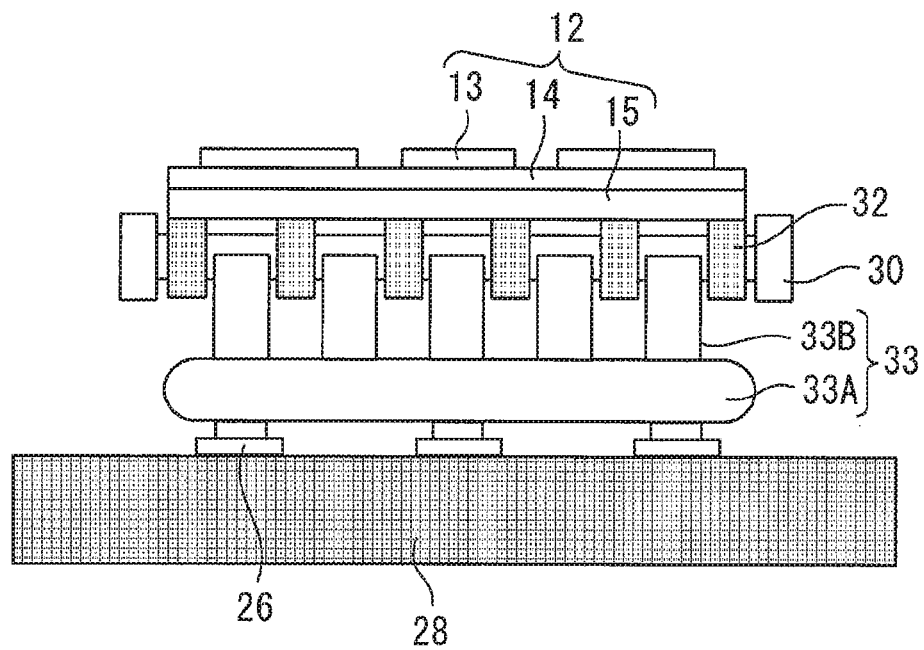
FIG. 23 is a side view of the apparatus shown in FIG. 21.

FIG. 23 is a side view of the apparatus shown in FIG. 21. When conveying a worksheet, the slit belts 32 come into contact with the insulating substrate 12. The slits are provided in the lower electrode 33 so that the lower electrode 33 does not contact the slit belts 32 or the insulating substrate 12, and the belts are set to move through the slits. Here, plural slits are provided in the lower electrode 33, and the belts are provided in the plural slits, whereby the conveyance of the insulating substrate can be stabilized.

Figure 24:
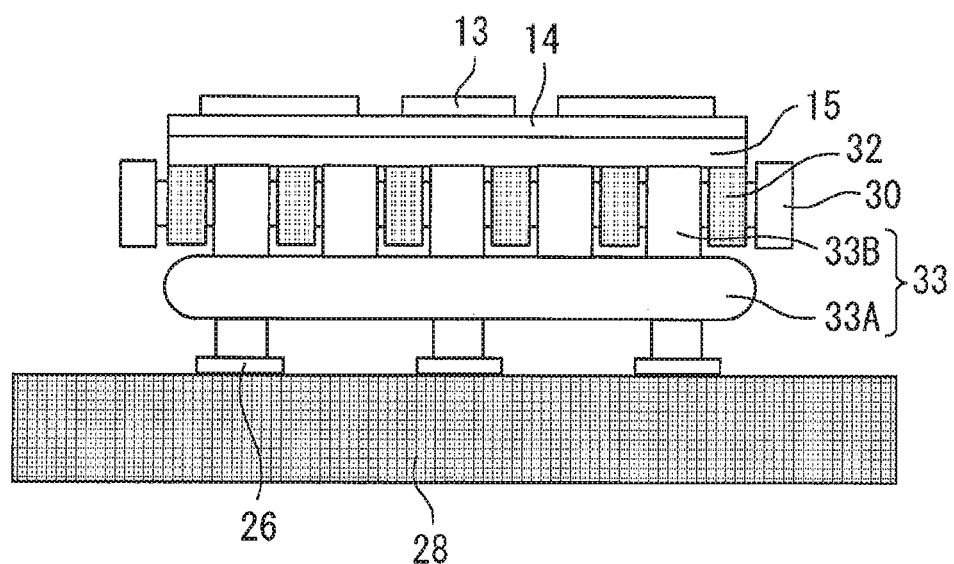
FIG. 24 is a side view of the apparatus shown in FIG. 22.

FIG. 24 is a side view of the apparatus shown in FIG. 22. The slit belts 32 are moved downward to bring the slit portion 33B of the lower electrode 33 and the lower metal 15 into contact with each other, thereby allowing application of a voltage to the insulating substrate 12. In other words, the slit portion 33B ascends between the slit belts 32, so that the slit portion 33B and the lower metal 15 can be brought into contact with each other. In this way, carrying of the insulating substrate 12 into and out of the inspecting apparatus and the inspection of the insulating substrate 12 can be automated, so that the inspection can be performed within the manufacturing process. Either a divided individual insulating substrate or a worksheet may be set as an inspection target.

The inspecting apparatus according to the fifth embodiment may be designed to have a different configuration so that a slit(s) is(are) formed in the lower electrode 33, and a belt conveyor is provided in the slit(s).

Sixth Embodiment

Figure 25:
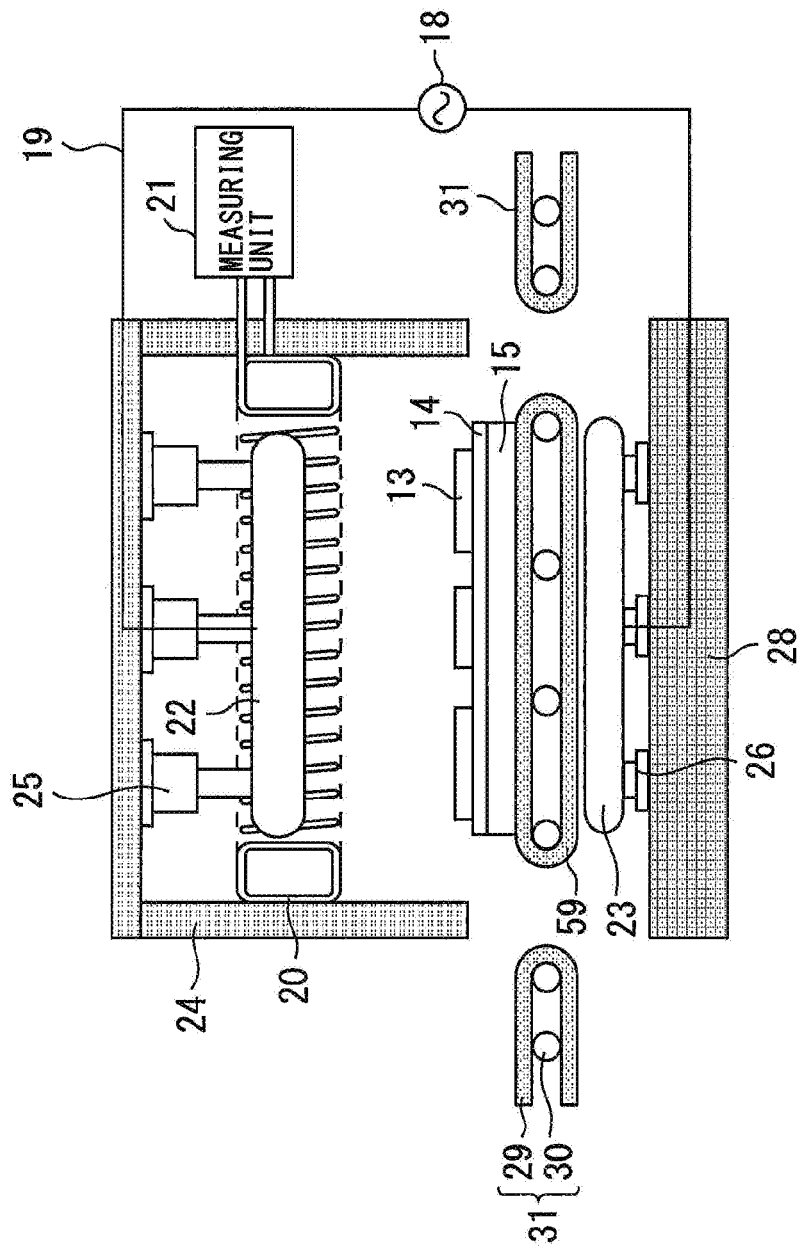
FIG. 25 is a diagram showing a configuration example of an inspecting apparatus according to a sixth embodiment.

FIG. 25 is a diagram showing a configuration example of an inspecting apparatus according to a sixth embodiment. A belt conveyor has a conductive belt 59 provided on the lower electrode 23. FIG. 25 shows that the conductive belt 59 is used to convey a worksheet in the apparatus. The insulating substrate can be moved by driving the conductive belt 59 which is in contact with the lower metal 15.

Figure 26:
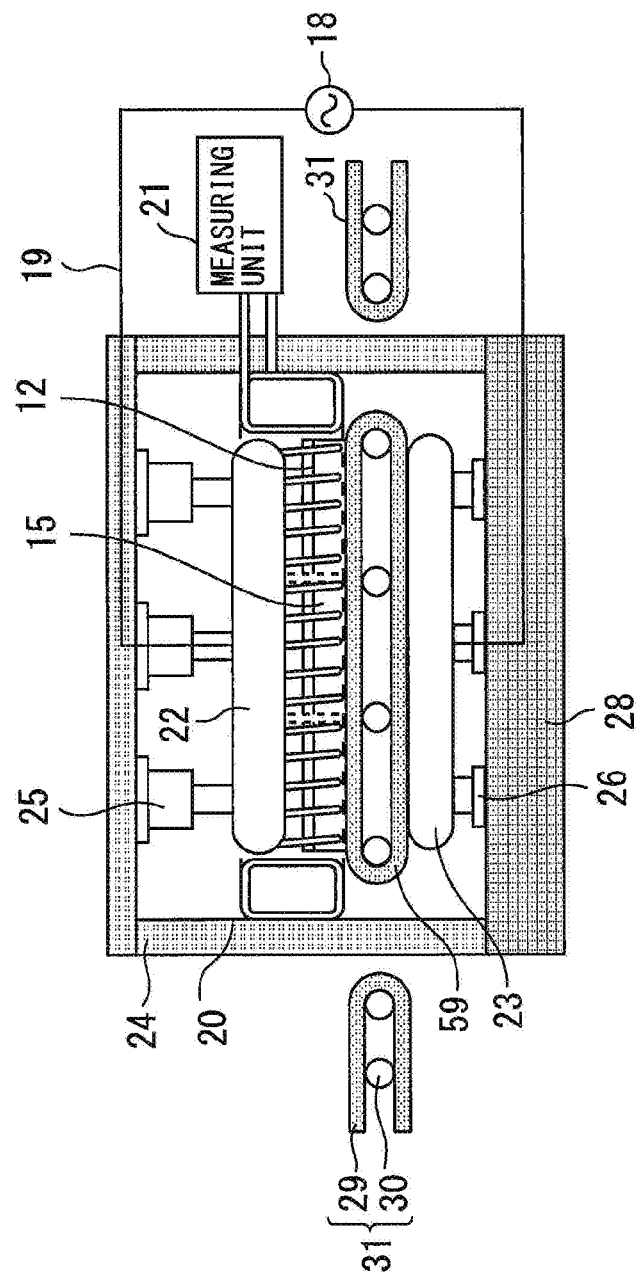
FIG. 26 is a diagram of the inspecting apparatus under the inspection of the insulating substrate.

FIG. 26 is a diagram of the inspecting apparatus under the inspection of the insulating substrate. The metal housing 24 and the stage 28 are brought into contact with each other, and the lower electrode 23 and the lower metal 15 are conducted to each other by the conductive belt 59 to perform the insulating substrate inspection. That is, detection of electromagnetic waves is performed while the conductive belt 59 are in contact with the lower electrode 23 and the lower metal 15. As a result, carrying of the insulating substrate 12 into and out of the inspecting apparatus, and the inspection of the insulating substrate 12 can be automated, and the inspection can be performed within the manufacturing process. Either a divided individual insulating substrate or a worksheet may be set as an inspection target. It is to be rioted that the features of the embodiments described above may be combined for use.

According to some examples, since an insulation defect of an insulating substrate is inspected before start of a semiconductor process or before start of a main process of the semiconductor process, it is possible to provide insulating substrate inspecting method and apparatus that are suitable for reduction of the cost.

The invention claimed is:

1. An insulating substrate inspecting method comprising:
bringing a lower electrode into contact with a lower metal of an insulating substrate including an insulating layer, the lower metal in contact with a lower surface of the insulating layer, and an upper metal in contact with an upper surface of the insulating layer, and bringing an upper electrode into contact with the upper metal;
applying an AC voltage to the lower electrode and the upper electrode; and
using an antenna to detect electromagnetic waves generated at a defect in the insulating layer.

2. The insulating substrate inspecting method according to claim 1, wherein
the insulating substrate, the lower electrode and the upper electrode are covered by a metal housing.

3. The insulating substrate inspecting method according to claim 1, wherein
the antenna is a loop face of a loop antenna for detecting the electromagnetic waves made coincident in height with the insulating layer, and the insulating layer is present in a tangential direction of the loop face.

4. The insulating substrate inspecting method according to claim 3, wherein
a plurality of loop antennas are provided, and the plurality of loop antennas have different detection frequencies.

5. The insulating substrate inspecting method according to claim 1, wherein
the insulating substrate is a worksheet in which a plurality of unit structures are integrated with one another, and the upper metal is patterned.

6. The insulating substrate inspecting method according to claim 1, wherein
the insulating substrate is a worksheet in which a plurality of unit structures are integrated with one another, and the upper metal is one metal layer for exposing a portion along an outer edge of the upper surface of the insulating layer.

7. The insulating substrate inspecting method according to claim 2, wherein
the electromagnetic waves are detected while the lower electrode, the upper electrode or the metal housing is heated.

8. The insulating substrate inspecting method according to claim 1, wherein
the electromagnetic waves are detected at a frequency of 1 to 10 GHz.

9. The insulating substrate inspecting method according to claim 1, wherein
the insulating substrate is determined to be defective when energy of the detected electromagnetic waves is larger than a predetermined value.

10. The insulating substrate inspecting method according to claim 1, wherein
the insulating substrate is a worksheet in which a plurality of unit structures are integrated with one another, and the electromagnetic waves are detected while scanning X-rays on the insulating substrate from an upper side of the insulating substrate, whereby the unit structure in which a defect exists is specified from a scan position of the X-rays when the electromagnetic waves are detected.

11. The insulating substrate inspecting method according to claim 10, wherein
the upper electrode has a grid-like shape.

12. The insulating substrate inspecting method according to claim 10, wherein
the unit structure in which the defect exists is marked.

13. The insulating substrate inspecting method according to claim 2, wherein
the metal housing includes a support portion surrounding the upper electrode, and a lid portion provided on the support portion, the upper electrode is attached to the lid portion via a conductive first elastic body, the lower electrode is attached to the stage via a conductive second elastic body, and the AC voltage is applied to the lower electrode and the upper electrode via the first elastic body and the second elastic body.

14. The insulating substrate inspecting method according to claim 1, further comprising
moving the insulating substrate by driving a belt that is provided in a slit of the lower electrode and is in contact with a lower surface of the lower metal.

15. The insulating substrate inspecting method according to claim 14, wherein
a plurality of slits are provided in the lower electrode, and the belt is provided in the plural slits.

16. The insulating substrate inspecting method according to claim 1, further comprising
moving the insulating substrate by driving a conductive belt in contact with the lower metal, wherein
detection of the electromagnetic waves is performed while the conductive belt is in contact with the lower electrode and the lower metal.

17. An inspecting apparatus comprising:
a lower electrode having a flat portion on an upper surface thereof;
an upper electrode that is provided on the lower electrode and has a flat portion on a lower surface thereof;

a power supply portion being configured for applying an AC voltage to the lower electrode and the upper electrode;

an antenna being configured for detecting electromagnetic waves and converting the electromagnetic waves to current; and a metal housing covering the lower electrode, the upper electrode, and the antenna.

18. The inspecting apparatus according to claim 17, wherein
the upper electrode has a grid-like shape in plan view, and the inspecting apparatus further comprises a scanning type X-ray irradiation device for irradiating X-rays in a direction to the lower electrode on an upper side of the upper electrode.

19. The inspecting apparatus according to claim 17, wherein
a slit is formed in the lower electrode, and the inspecting apparatus further comprises a belt conveyor provided in the slit.

20. The inspecting apparatus according to claim 17, wherein
the inspecting apparatus further comprises a belt conveyor having a conductive belt provided on the lower electrode.

* * * * *